US005652518A

United States Patent [19]
Wurl

[11] Patent Number: 5,652,518
[45] Date of Patent: Jul. 29, 1997

[54] DIGITAL FILTER PRE-CHARGING

[75] Inventor: Jon G. Wurl, Sunnyvale, Calif.

[73] Assignee: Varian Associates, Inc., Palo Alto, Calif.

[21] Appl. No.: 661,516

[22] Filed: Jun. 11, 1996

[51] Int. Cl.$^6$ ................................................ G01R 33/28
[52] U.S. Cl. ................................ 324/322; 324/318
[58] Field of Search .................. 324/318, 322, 324/314, 309, 307, 300

[56] References Cited

U.S. PATENT DOCUMENTS

| | | | |
|---|---|---|---|
| 4,992,736 | 2/1991 | Stormont et al. | 324/309 |
| 5,170,123 | 12/1992 | Holland et al. | 324/322 |
| 5,560,361 | 10/1996 | Glusick | 324/309 |

OTHER PUBLICATIONS

Halamek et al, "The Elimination of Baseline Distortions Induced by Audio Filters" J. of Mag. Res. Series A 110, (1994) pp. 194–197.

Tang, C., "A Analysis of Baseline Distortion and Offset in NMR Spectra," J of Mag. Res. Series A109, (1994), pp. 232–240.

Starcak, "First–Data Point Problem and Baseline Distortion in FT NMR Spectroscope with Simultaneous Sampling" J. of Mag. Res Series A 108, (1994) pp. 177–188.

Zhu et al, "Discrete FT of NMR Signals, The Relationship between Sampling Delay Time and Spectral Baseline" J. of Mag. Res., Series A105, (1993) pp. 219–222.

Froystein, "Removal of All Baseline and Phase Distortion from 2D NOE Spectra by Tailored Spin Echo Evolution and Dection" J of Mag. Res. Series A103, 1993, pp. 332–337.

Bax et al, "Removal of $F_1$ Baseline Distortion and Optimization of Folding in Miltidimensional NMR Spectra" J. of Mag. Res. No. 91 (1991) pp. 174–178.

Lippens et al "Perfectly Flat Baselines in 1D and 2D Spectra with Optimized Spin Echo Detection," J. of Mag Res, No. 88 1990 pp. 619–626.

Starcuk et al, "Correction of Baseline and Lineshape Distortions in FT MR Spectroscopy by Estimation of Missing Signals;" J. of Mag. Res. No. 88 (1990) pp. 619–826.

Marian et al, "Communication—Baseline Distortion in Real FT NMR Spectra" J of Mag Res. No. 79, 1988 pp. 352–356.

Hoult et al, "Elimination of Baseline Artifacts in Spectra and Their Integrals" J. of Mag. Res. No. 51, 1983 pp. 110–117.

*Primary Examiner*—Sandra L. O'Shea
*Assistant Examiner*—Raymond Y. Mah
*Attorney, Agent, or Firm*—Edward H. Berkowitz

[57] ABSTRACT

A method for treating M-degree oversampled impulse response data in real time includes generating N initial pseudo-data points derived from an N tap digital filter, processing each datum therewith, down sampling by a factor of r and displacing the processed datum toward the time origin by an appropriate amount. After fourier transform of the data set, the spectral background information bears improved fidelity to the actual spectral noise.

5 Claims, 11 Drawing Sheets

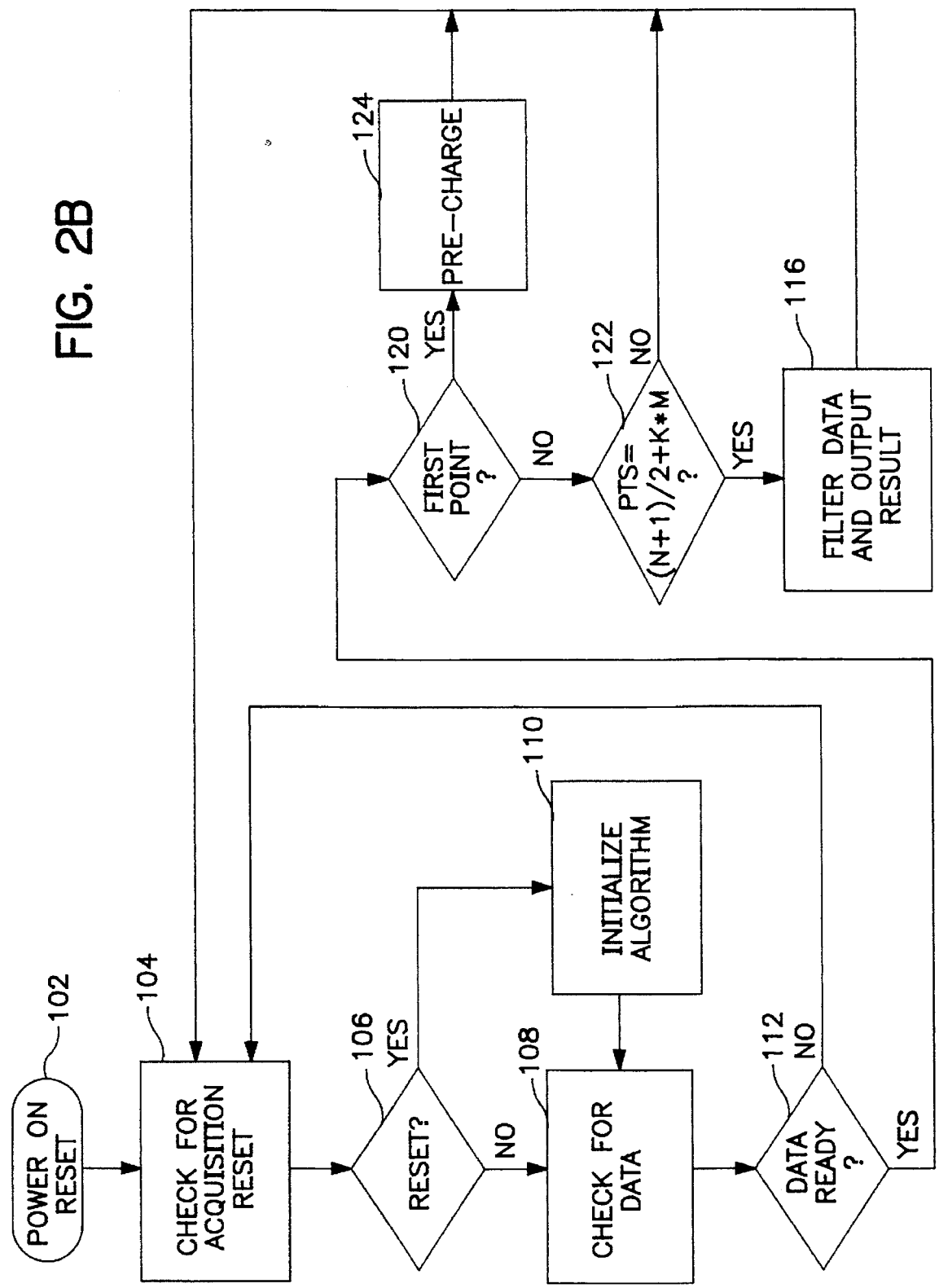

5,652,518

DIGITAL FILTER PRE-CHARGING

FIELD OF THE INVENTION

The invention is principally in the field of nuclear magnetic resonance methods and is particularly related to digital signal processing of NMR signals.

BACKGROUND OF THE INVENTION

Modern fourier transform NMR is accomplished in apparatus including a receiver coupled to analog to digital converters sampling a bandlimited continuous time domain function at sampling rates which may be in the range from a few kilohertz to a few megahertz. The signal experiences a variety of processing steps. For example, an analog band limiting filter is imposed to limit the frequency content of the signal. A number of operations may be applied to the data set which represents the time domain data as a discrete digital data set.

The free induction decay (FID) signal which is commonly acquired in NMR measurements is a superposition of a number of exponentially decaying RF signals arising from the de-excitation (re-orientation) of resonant nuclear spins. This signal is mixed down to an audio-frequency spectrum using quadrature detection techniques commonly employed for single sideband detection. This information may be regarded as the sum of a set of exponentially decaying oscillators, each oscillator frequency representing an offset from the RF carrier. It is usually assumed that there is some physical time origin at which all these oscillators are in phase, but such time origin is only approximate. Also present in this signal is noise generated by the sample signal detection subsystem (probe) and/or the analog electronics preceding the digitizers.

The requirements of an NMR signal processing system include the need for high dynamic range and accurate treatment of the system noise. The dynamic range is limited by the resolution of the ADC and usually the limit is established through a type of error known as quantization noise. It is desirable that the quantization noise be smaller than the system noise in order that the latter be treated accurately. A well known technique for accomplishing this is called oversampling. The signal is sampled some factor faster than the final desired rate, some type of digital filter is applied to this oversampled data, and then the data is reduced back down to the desired rate. It is possible to oversample and to keep the entire oversampled data set without reducing it back down, but this is undesirable because the amount of data to store is unnecessarily large.

Oversampling is the technique which improves the quality (signal to noise) of the data, but at issue here is the fact that oversampling establishes the need for digital filtering, and digital filtering is the focus of the invention.

The most desirable digital filter is performed in real time, presents the data to the host computer such that no further processing is required—in particular such that no phase correction is required—and introduces no other spectral artifacts, such as a rolling baseline.

A real time process operating on a continuous stream of discrete (digital) data is one where there is no accumulating time delay in the output data from the process. It is possible, for example, to have a process which is computationally intensive for every Mth input point, but some of the non-intensive time slack can be made available for use by the intensive part of the process such that the overall process rate remains on track.

It is known to apply digital filtering in real time to an NMR time domain signal. However, typically a large (many times 360 degrees-per-hertz) phase correction needs to be applied. This is because commonly employed digital filters delay the in-phase point. Two entirely equivalent methods for correcting this unphased data are phase correction of the spectrum through a linearly varying weighted sum of the real and imaginary spectral components, or through rotating the data prior to the transform from the time domain to the frequency (spectral) domain. Data rotation is a similar manipulation wherein an early portion of the detected signal is stored at the distal end of the data table. Note that both methods have the undesirable feature that the entire data set must be available before processing.

It is possible to perform a real-time phase correction of the digitally filtered data by ignoring all output data prior to the in-phase point. This method is something akin to a digital left shift, as might be employed on the bits of a single data register, as distinct from a rotate left, which is akin to the data rotation method. The left-shift method, however, produces undesirable artifacts in the baseline.

SUMMARY OF THE INVENTION

In one aspect of the invention a real time digital filter is implemented by an initialization of the filter with a window function spanning an interval extending back from the first datum to an origin wherein all frequency components are in phase (to a good approximation).

In another aspect of the invention, signal to noise properties of the filtered spectrum are improved and substantially no artifacts are introduced into the spectral baseline.

In yet another aspect of the invention, the digital filtering is accomplished in real time with acquisition of the data set.

BRIEF DESCRIPTION OF THE DRAWINGS

FIG. 2B is a block diagram of the steps comprising the present real time digital filter operation.

DETAILED DESCRIPTION OF THE INVENTION

Figure 1:
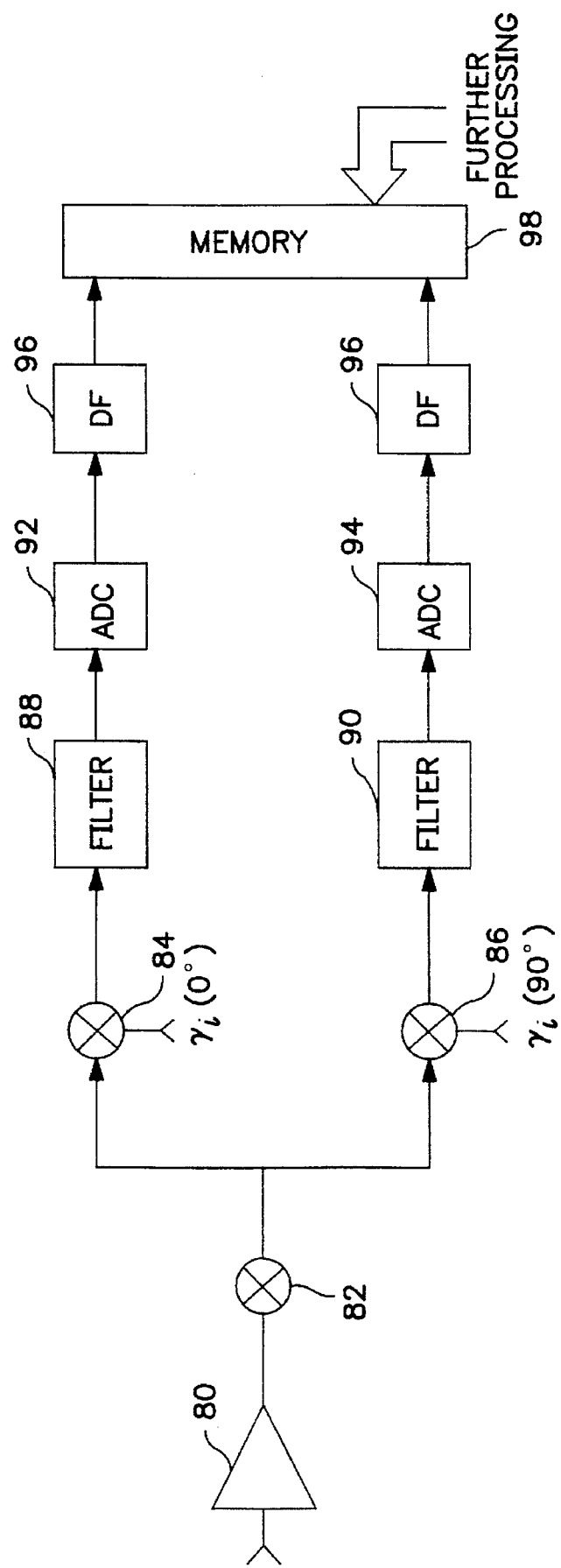
FIG. 1 is a block diagram of the relevant signal processing context of the invention.

FIG. 1 describes the instrumental context of the invention at the signal processing level close to the invention. An RF signal is derived from the NMR probe, which may include suitable pre-amplification, and is directed through amplifier 80 to mixer 82 where a low frequency (IF) signal is mixed to yield a reduced frequency signal. The reduced frequency signal is split and directed in parallel paths to respective phase sensitive detectors 84 and 86 to yield respective quadrature related components. These signal components are subject to low pass filters 88 and 90 and then processed by respective ADCs 92 and 94. At this point, the digital filter 96 effectuated by a digital processor (not shown) operates upon each datum as it becomes available at, the output of the component ADCs 92 and 94. Following the digital filter, the datum is recorded in memory 98 for subsequent processing via the host computer, not shown.

Figure 2A:
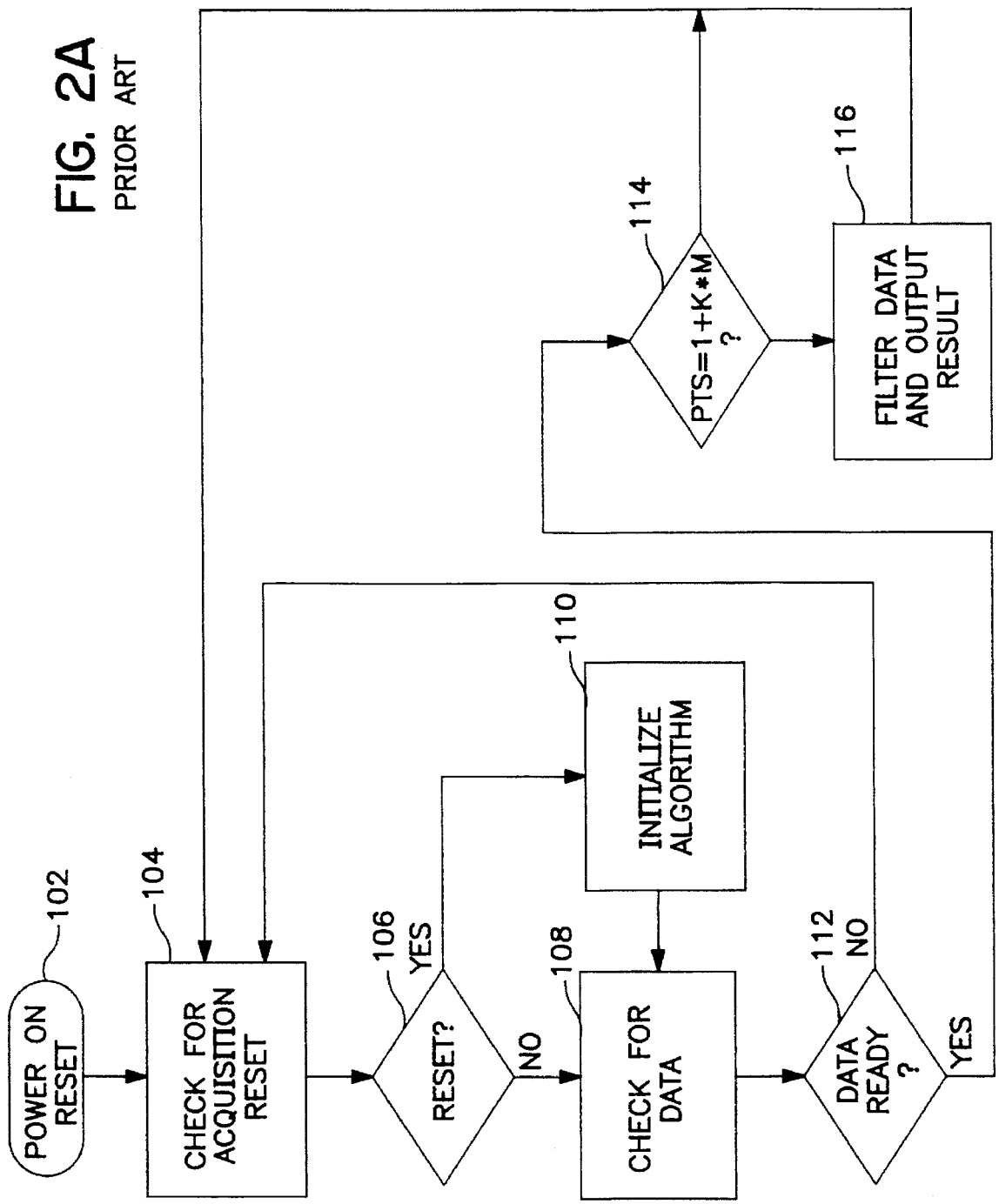
FIG. 2A is a block diagram of the steps comprising the real time digital filter operation of the prior art.

FIGS. 2A and 2B are flowcharts which illustrate the real-time process which occurs to the incoming data, for both the standard current practice and for the invention, when the data is oversampled, digitally filtered and then downsampled. In both cases the actions indicated by "check for acquisition reset" at block 104 and "check for data" at block 108, in practice are usually performed simultaneously via hardware interrupt. A well known alternative to the hardware interrupt is a "polling technique" and strictly speaking it is the polling technique which the flowcharts are representing, but for all issues related to the current discussion the flowcharts accurately reflect hardware interrupt techniques.

Note that for standard current practice as well as for the invention the digital signal processor needs to receive a signal from the console as to when the acquisition begins (acquisition reset) because the count of points is made with respect to the first point, and because processes and data buffers need to be cleared of residual data etc. from previous acquisitions. This then defines "first" and "Mth" in the flowcharts.

In FIG. 2A block 102 represents the processing entry point. In an embedded real-time system, for example, when digital power is applied, the controlling code is "bootstrap loaded" into system memory. From this point on the algorithm is ready for continuous operation. Blocks 104, 106, 108, 110, and 112 represent the above-mentioned check for whether data is ready, and the check for acquisition reset, to account for whether the incoming data is the first point, second point, third point etc. In practice a processor register or memory location is dedicated to a count of points acquired and is incremented with each incoming data point.

For the current standard practice the digital filter is applied at the first point and every Mth point thereafter, where M is the oversampling/downsampling factor. The check for whether the filtering should occur is represented by block 114, where a comparison is made between the points acquired count and 1+k*M, with k=0,1,2, . . . .

The filter itself is represented by block 116. A digital filter is invariably a weighted sum. Sometimes the calculation may include some number of previous output points as well as some number of input points, but for simplicity the present discussion will assume a filter operating on input points only. For a filter length of N coefficients, a subset of the incoming data of length N is chosen and the output consists of each of the N data points multiplied by a corresponding coefficient with the entire set of N products added together to form a single output point.

It is important to note that in current standard practice if there has been only one acquired point an assumption must be made about what the other N−1 coefficients need to be multiplied by. In other words, a subset of N data points cannot be obtained from only one point. The almost universal assumption is that the other N−1 points have a value of zero. This same situation likewise occurs up until at least N input points have been acquired.

FIG. 2B shows the process flow for the invention. The power on reset (102), acquisition-reset check (104, 106, 110) and data-ready check (108, 112) are identical to current standard practice. The central distinction the invention has from current standard practice is that (1) at the first acquired point the data is pre-charged to smooth out the abruptness, and (2) the filter is not applied for the first time until the (N+1)th point is received. These algorithmic checks and actions are represented by blocks 120, 122 and 124. When the filter is applied, it is the same as a filter used in current standard practice.

The pre-charging consists of pre-appending the actual incoming data with pseudo data which is to be used in the output point calculations as if it were real data. It is a smoothly-weighted set of data generated by multiplying a weighting function by the first point, or:

$$p(n) = w(n)*x(1), n = 1, 2, \ldots, \frac{N-1}{2} \quad \text{Equ. 1}$$

There are many possible choices for the weighting function, but apparently an optimum one is that which is used to generate the digital filter coefficients. For example, if a blackman digital filter with N=105 coefficients is to be employed, then:

$$w(n)=0.42-0.5 \cos (\pi(n-1)/52)+0.08 \cos (\pi(n-1)/26) \; n=1, \ldots, 52 \quad \text{Equ. 2}$$

Figure 3A:
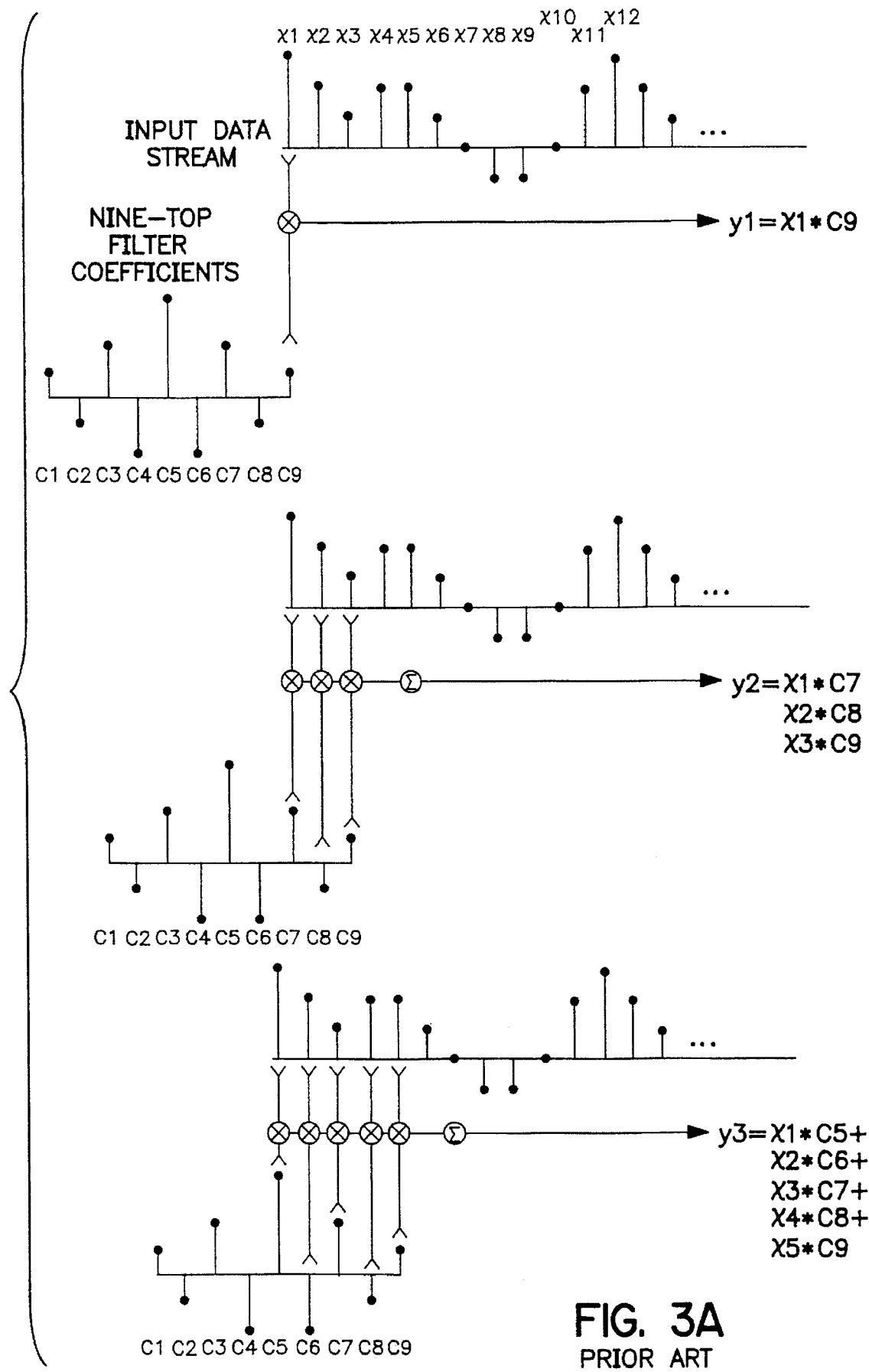
FIG. 3A illustrates a simple pedagogical example of the operation of a digital filter of prior art.
Figure 3B:
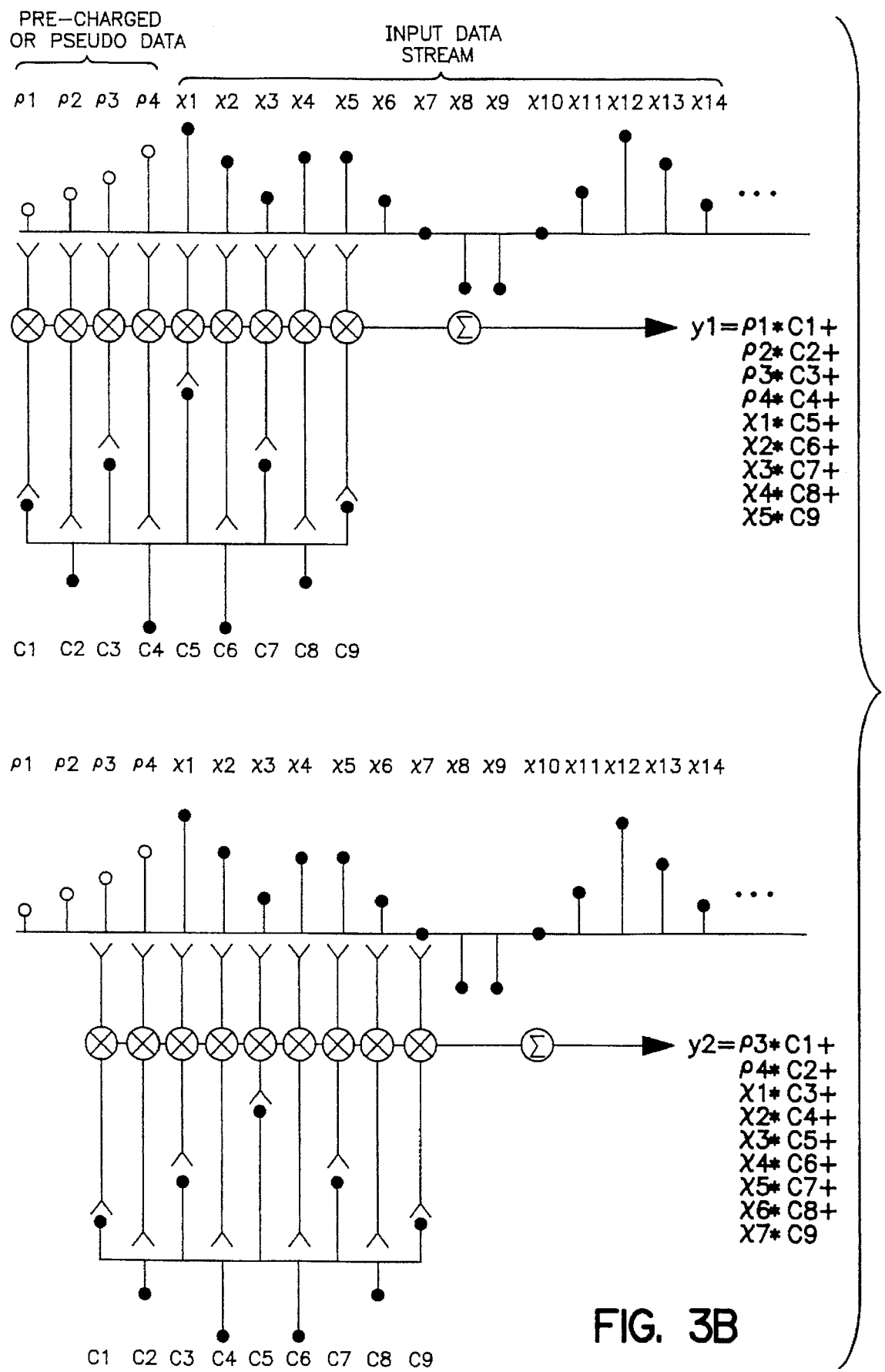
FIG. 3B illustrates a simple pedagogical example of the operation of the same digital filter as in FIG. 3A using the present invention.

FIGS. 3A and 3b illustrate a simple pedagogical model for understanding the distinction between current standard practice and the invention. In FIG. 3A an input data stream, oversampled by a factor of 2, is to be filtered and downsampled. The filter is nine coefficients long—called a nine-tap filter in the jargon. The downsampling is performed by only executing the multiply-add operation for every other input point. Thus the output points in order become:

$y1=x1*c9$ $y2=x1*c7+x2*c8+x3*c9$ $y3=x1*c5+x2*c6+x3*c7+x4*c8+x5*c9$ etc.

After the fifth point there will be nine multiplications in every sum for this simple example.

At the output, the zero-phase point is now y3, so that when the discrete fourier transform (DFT) is performed a linear phase shift is required. As mentioned above, an equivalent operation would be to accumulate all the data and rotate it, in this case by two points.

Also as mentioned above, a left-shift operation is a possible real-time option, but this causes spectral artifacts.

FIG. 3B represents the invention. The output points become:

$$y1=p1*c1+p2*c2+p3*c3+p4*c4+x1*c5+x2*c6+x3*c7+x4*c8+x5*c9$$

$$y2=p3*c1+p4*c2+x1*c3+x2*c4+x3*c5+x4*c6+x5*c7+x6*c8+x7*c9$$

The first point y1 is now situated in time at the zero phase point, as if the data had been left shifted, but the precharging eliminates the spectral artifacts.

The invention has been studied from empirical results which will now be presented. These results are derived from simulation studies and from operations in real time on actual spectral data.

In order to study the effect of the invention via simulation techniques a computed FID is defined by a complex function $$x(n)=r(n)+i(n) \quad \text{Equ. 5}$$

$$r(n)=\text{int}\ (10000\ e^{(n-1)/(-302.83)}+0.5),\ n=1,\ldots 3200$$

$$i(n)=\text{int}\ (-2000\ e^{(n-1)/(-302.83)}+0.5),\ n=1,\ldots 3200$$

Figure 4A:
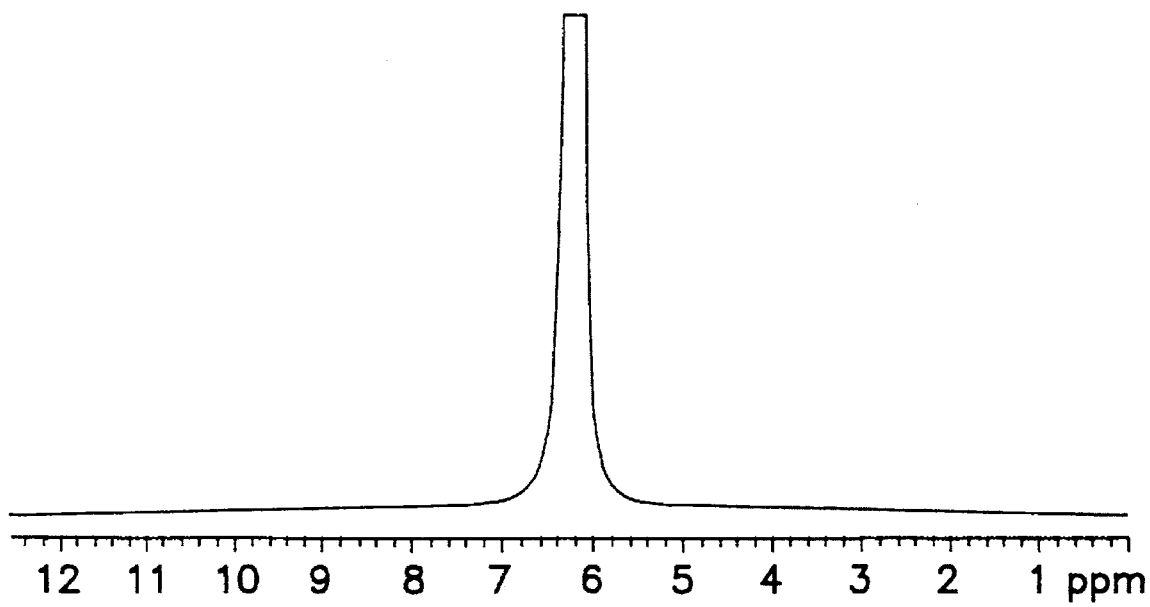
FIG. 4A shows the DFT of the time domain function x(n) of Equ. 5.
Figure 4B:
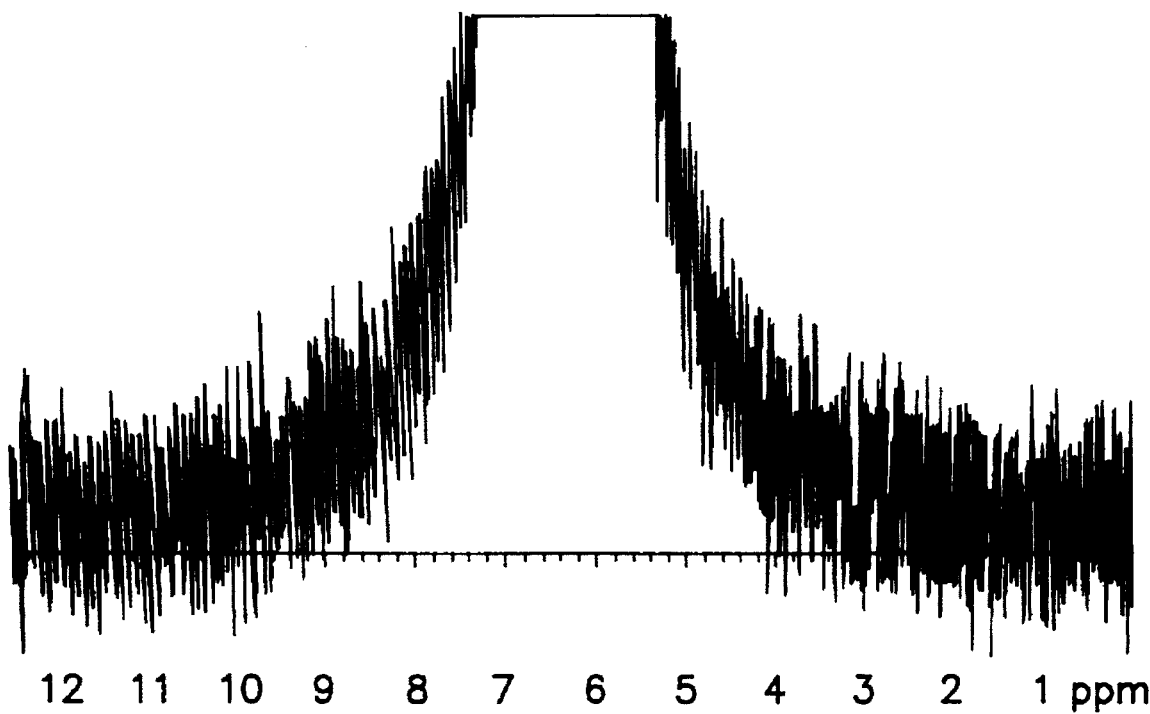
FIG. 4B shows the spectrum of FIG. 4A on an expanded ordinate (×100).

The scale factors have simply been selected to provide a realistic time domain exponentially decaying function. The DFT is applied to the data table describing x(n) to yield the frequency spectrum of FIG. 4A. FIG. 4B is the identical spectrum re-plotted at an ordinate 100 times that of FIG. 4A in order to explicitly exhibit the behavior of the noise. In this simulation, noise is conveniently simulated by the roundoff that occurs in the computational generation of each datum of the time domain function x(n) and by the processing of the DFT. This quantization is similar to that resulting upon digitization of analog data by the ADC. FIGS. 4A and B thus provide a model data set upon which to operate and to which comparisons may be made with the signal processing steps of the inventive method. The noise defining the spectral baseline is a limiting feature for the sensitivity of NMR instruments. In the present simulation exercise the relative behavior of this quantization noise is an important feature of the invention. (Data presented herein are truncated in amplitude to properly display the continuum in the neighborhood of the spectral peak).

In the empirical study, a 105 tap blackman filter was employed. In general, the blackman coefficients are generated by:

$$c(k)=b\ \text{sinc}\ [b\pi(k-a)][0.42-0.8\cos(k\pi/a)+0.08\cos(2k\pi/a)]$$
$$a=(N-1)/2 \quad \text{Equ. 6}$$

The parameter b defines the digital filter bandwidth and is often set to the reciprocal of the oversampling factor, b=1/M.

Figure 5:
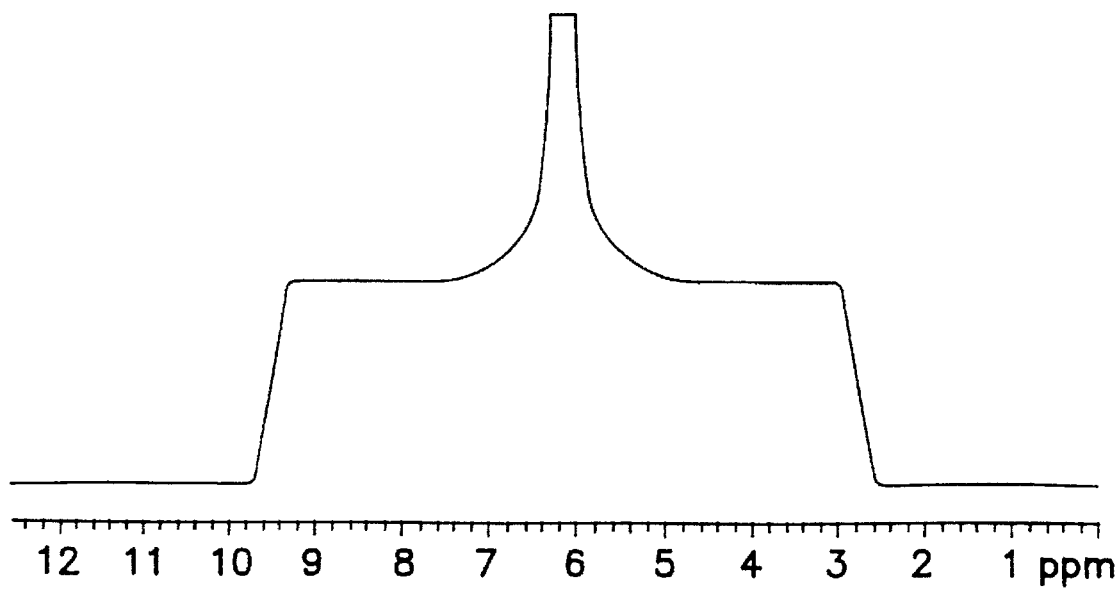
FIG. 5 shows the effect on x(n) of the selected blackman filter (without use of the invention) prior to DFT.

If one applies the filter described above (Equ. 6) to the simulated data without pre-charging (Equ. 5), FIG. 5 results. A substantial phase correction has been applied to remove oscillations from the platform under the spectral peak. The platform itself is simply the result of the discontinuity represented by acquisition of the first datum.

In typical operation, real data are acquired by an oversampling procedure as discussed above. The ADC operates at a rate in excess of the spectral width requirements for the measurement. After application of the filter to a datum, the proper spectral width is recovered by discarding data points systematically. For example, oversampling by a factor of two is compensated, after application of the filter through downsampling by a factor of two, easily accomplished by discarding alternate processed points. The simulated data of FIGS. 4A and 4B (and equ. 5) may be regarded as over-sampled by a factor of two. FIG. 6 displays the additional effect upon the transformed data of FIG. 5 when downsampling by 2 is applied prior to the DFT. The reduction of spectral width is expressly indicated on the abscissa.

Figure 6A:
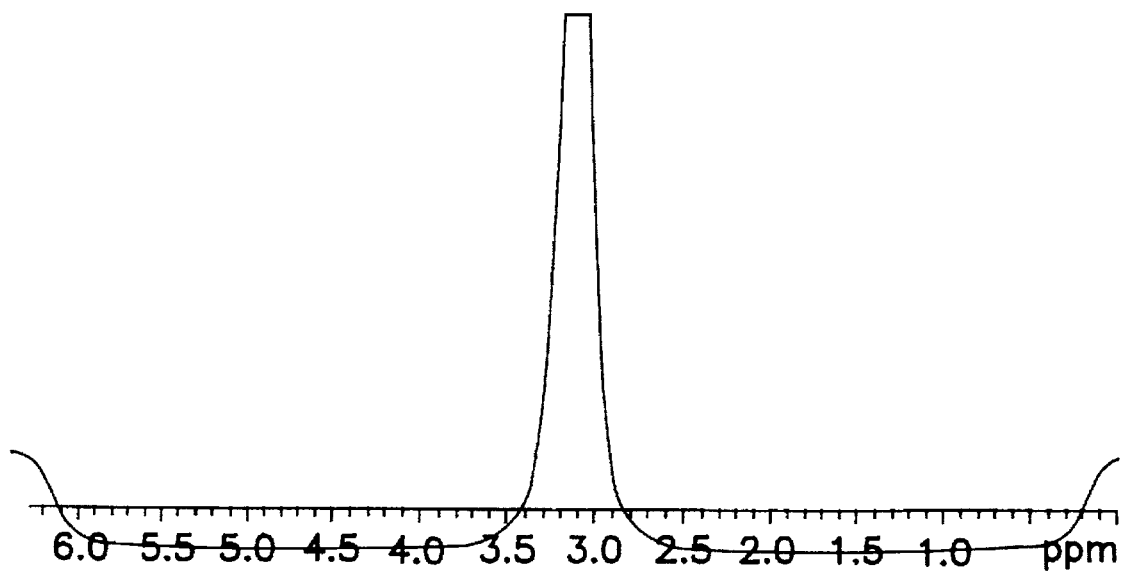
FIG. 6A shows the effect on x(n) of the selected blackman filter (without use of the invention) and downsampled ×2 prior to DFT.
Figure 6B:
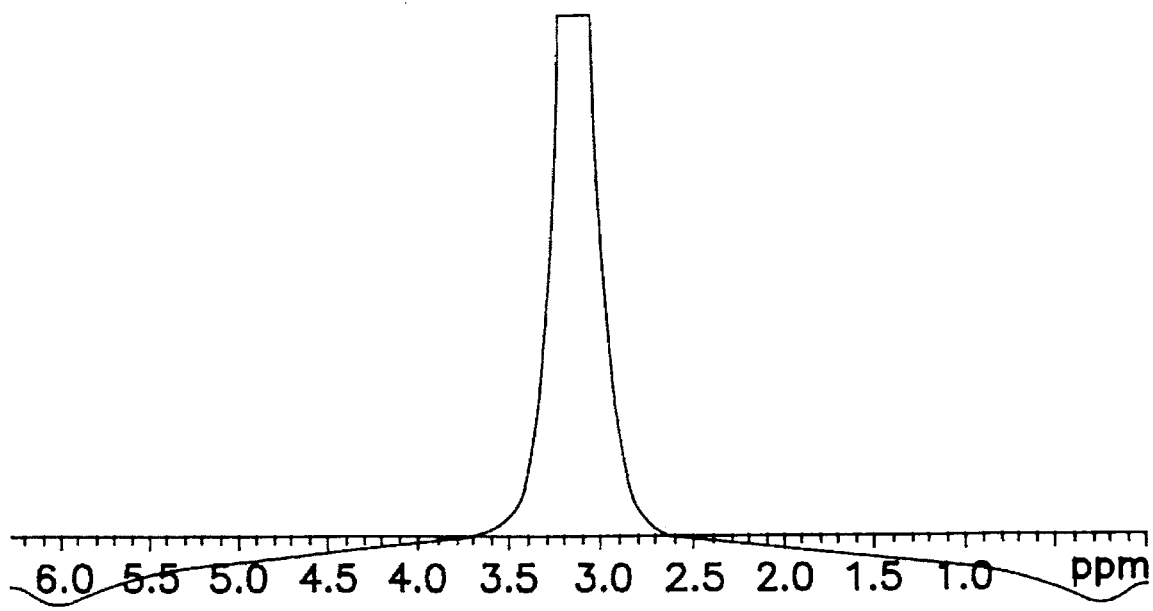
FIG. 6B is the same as FIG. 6A with the additional step of a left shift displacement of the filtered downsampled data (toward the time origin).

FIG. 6B uses downsampled non-precharged data as used in FIG. 6A except that the data is leftshiftdisplaced (toward the time origin) prior to the application of the DFT. Thus while no post-processing phase correction would need to be employed, spectral artifacts remain.

The empirical simulation employs equation 2 to obtain the first (N−1)/2=52 points of the precharged data table. This data table can be expressed as $$r(n)=\begin{cases} 10000w(n) & n=1\ldots 52 \\ \text{int}(10000e^{(n-1)/(-302.83)}+0.5), & n=53,\ldots 3252 \end{cases} \quad \text{Equ. 7}$$

$$i(n)=\begin{cases} -2000w(n) & n=1\ldots 52 \\ \text{int}(-2000e^{(n-1)/(-302.83)}+0.5), & n=53,\ldots 3252 \end{cases}$$

Figure 7A:
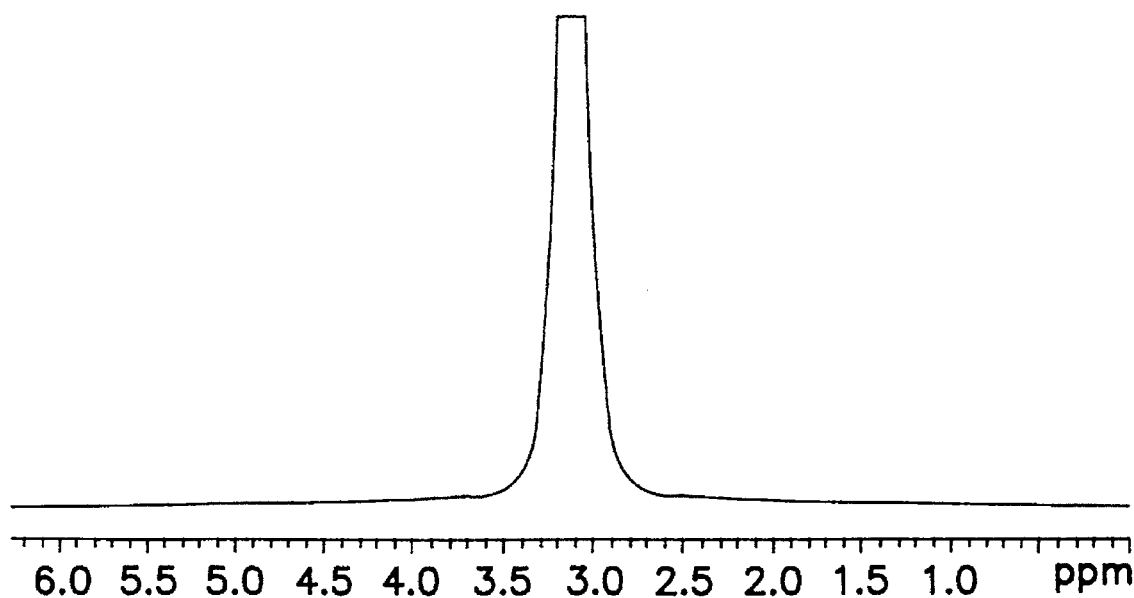
FIG. 7A is filtered, downsampled data with the additional use of the invention.
Figure 7B:
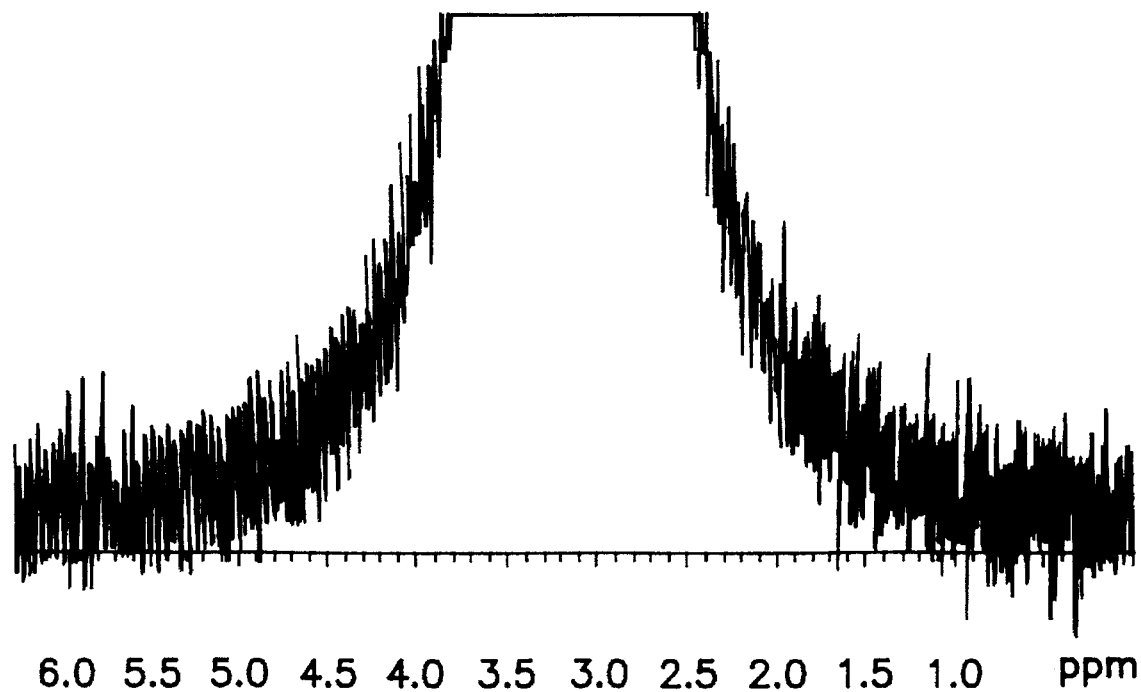
FIG. 7B shows the spectrum of FIG. 7A on an expanded ordinate (×100).

The data in equation 7 are digitally filtered and downsampled and the result of the application of of the DFT without any subsequent post processing is displayed in FIGS. 7A and 7B. Comparison of FIGS. 7A and 7B with FIGS. 4A and 4B demonstrates that the present invention is capable of providing effective real time digital filter processing with acceptable fidelity to the "actual" spectral distribution.

Figure 8:
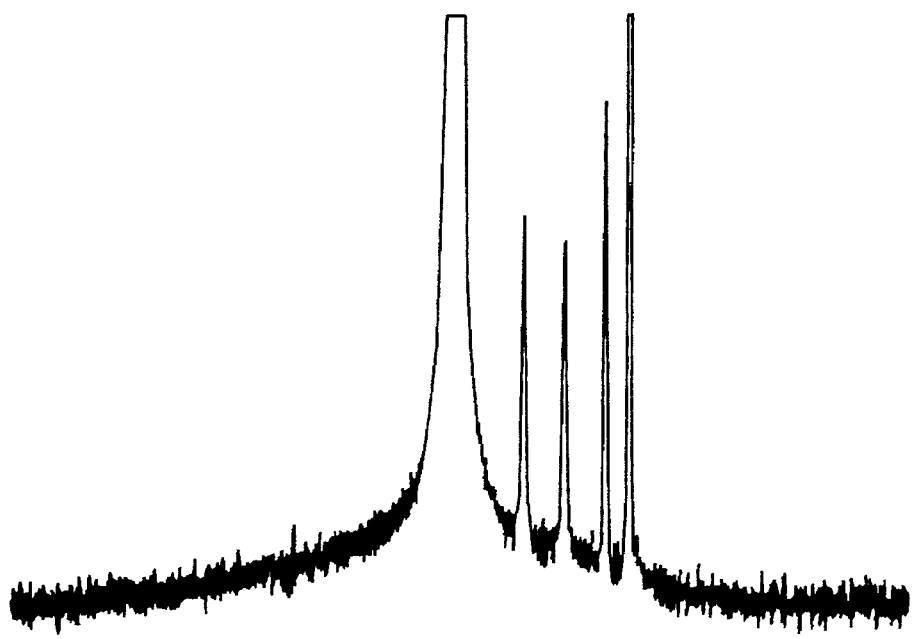
FIG. 8 is a spectrum of a doped water sample acquired in standard fashion without any digital filtering.
Figure 9:
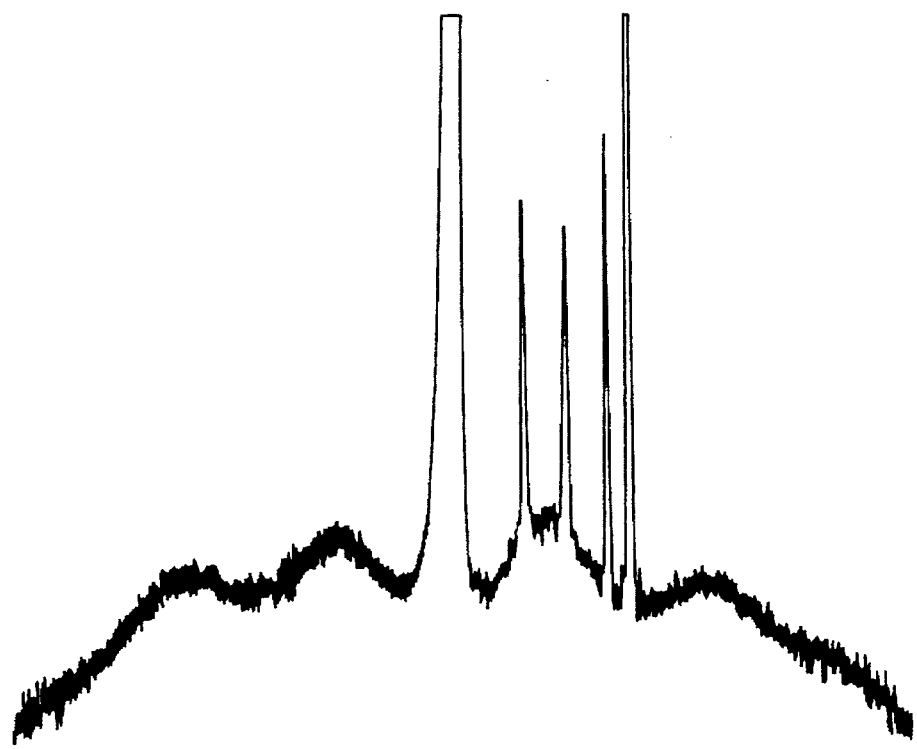
FIG. 9 is a spectrum of the same sample as in FIG. 8 with non-precharged digital filtering.
Figure 10:
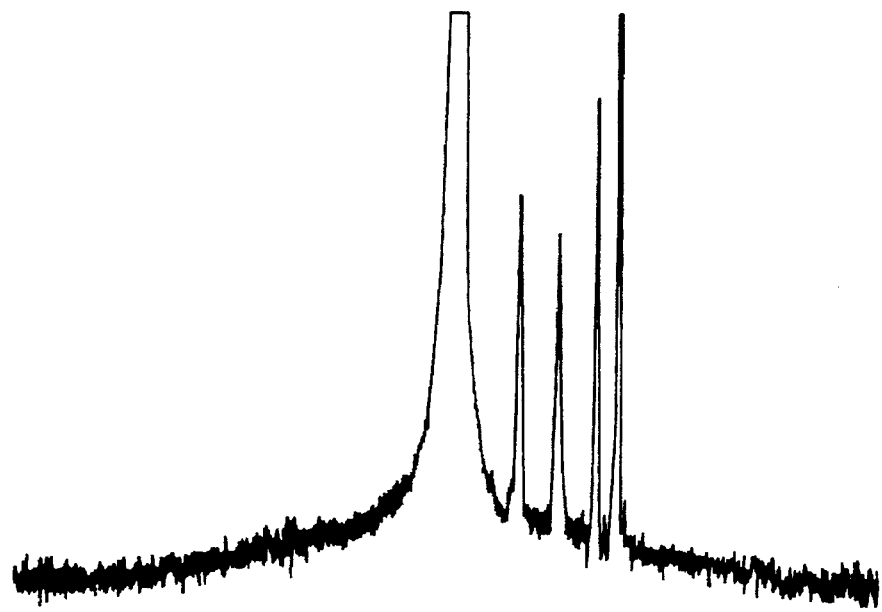
FIG. 10 is a spectrum of the same sample with the same digital filter, further employing the invention.

The same procedures which have been described above in respect to the controlled data of a simulation experiment have been applied to acquisition of NMR data from actual spectrometer operation. In this discussion, the ordinary procedures for initializing the instrument at the system level are well recognized by one of ordinary skill and are neither within the scope of the invention nor bear upon the efficacy of the procedures for processing measured data, which constitute the invention. First, consider a $GdCl_2/DSS$-doped water sample acquired without digital filtering at a bandwidth of 5 Khz as shown in FIG. 8. These data are presented for the relative shape of the continuance in the neighborhood of spectral perks. The axes are unimportant. The same sample spectrum, acquired with non-precharged digital filter (105 tap Blackman) and oversampling by a factor of 20, is shown in FIG. 9. The undulations in the baseline are indicative of effects similar to those examined with simulated data above. Using the present invention, the same sample spectrum is acquired yet again and the result is shown in FIG. 10. No post-processing has been applied to the spectrum of FIG. 10. The spectra of FIGS. 8 and 10 compare very favorably.

Figure 11:
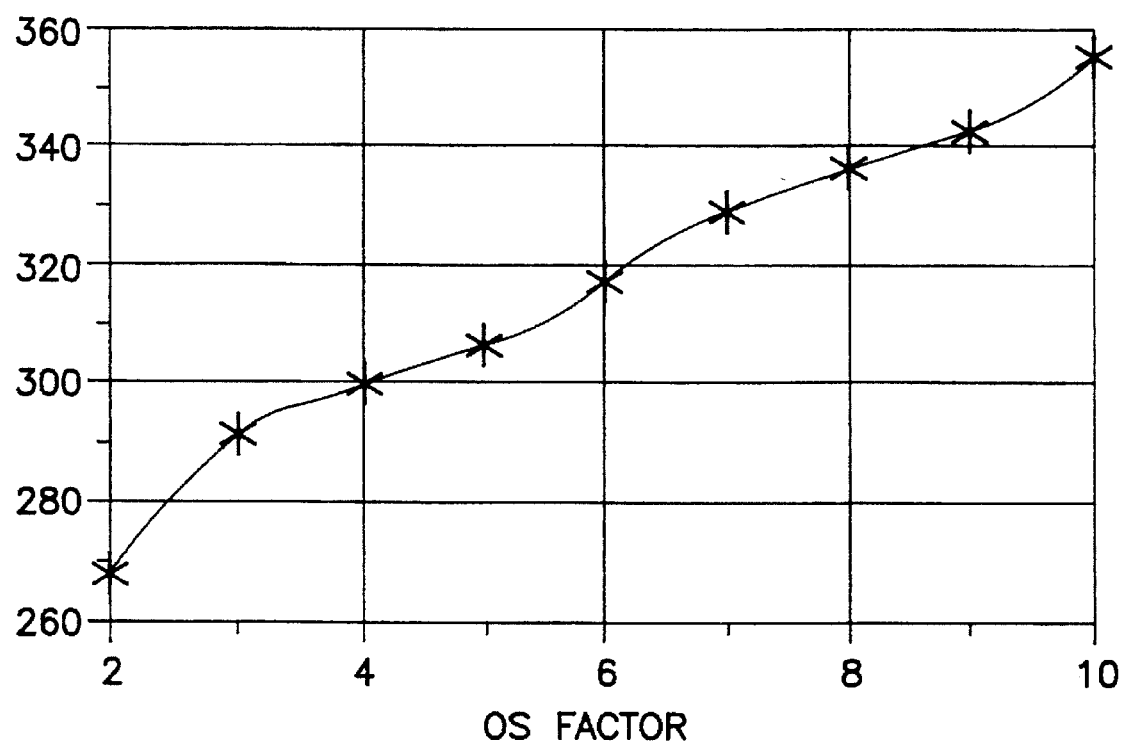
FIG. 11 shows the dependence of the signal to noise parameter on the oversampling rate as permitted employing the present invention.

Oversampling is beneficial in distributing noise over a large bandwidth, and the digital filter is then invoked to recover the desired bandwidth. Thus prior art digital filtering (without post-acquisition processing) which introduces baseline artifacts, diminishes to some extent the benefit of the oversampling procedure. FIG. 11 shows the measured signal-to-noise parameter as a function of the oversampling factor when the present invention is employed. This data was acquired on a Varian UnityPlus spectrometer at a relatively low receiver gain of 10.

The examples discussed herein have employed a 105 tap Blackman filter. Many other filter functions are expected to perform as well, or better for the practice of this invention.

Although the example of NMR data has been used, the invention disclosed herein is not limited to the field of NMR. Any real time digital filter operation for processing impulse data may profitably employ the invention.

It will be appreciated by those of ordinary skill having the benefit of this disclosure that the illustrative embodiments described above are capable of many variations without departing from the scope and spirit of the invention. Accordingly, the exclusive rights sought to be patented are as described below.

What is claimed is:

1. The method of establishing a real time processed data table of P values from P measured values representing an impulse response for subsequent discrete fourier transformation, comprising (a) computing a first plurality of $(N-1)/2$ consecutive values of said table based upon a selected digital filter of length N coefficients, where $(N-1)/2<P$ and pre-appending said computed entries as $(N-1)/2$ initial respective values of said sequence of P measured values, (b) acquiring each of P data points and treating each $k^{th}$ said data point as the $(N-1)/2+k^{th}$ in the sequence of values, (c) operating in real time upon each $P+(N-1)/2$ said data points with said digital filter, (d) retaining each of k processed values for storage.

2. The method of claim 1 wherein the step of acquiring further comprises oversampling said impulse response by a factor M.

3. The method of claim 2 wherein said step of operating further comprises downsampling said impulse response by said factor M whereby said oversampling step is compensated.

4. The method of claim 3 further comprising selecting from $P+(N-1)/2$ values, thosemeasured and real time processed values to form a transform set.

5. The method of claim 4 comprising transforming the transform set to the frequency domain.

* * * * *